United States Patent
Rantala

(10) Patent No.: US 7,833,820 B2
(45) Date of Patent: Nov. 16, 2010

(54) NANOPARTICLE CONTAINING SILOXANE POLYMERS

(75) Inventor: Juha Rantala, Espoo (FI)

(73) Assignee: Silecs Oy, Espoo (FI)

( * ) Notice: Subject to any disclaimer, the term of this patent is extended or adjusted under 35 U.S.C. 154(b) by 192 days.

(21) Appl. No.: 12/000,553

(22) Filed: Dec. 13, 2007

(65) Prior Publication Data

US 2008/0188032 A1 Aug. 7, 2008

Related U.S. Application Data

(60) Provisional application No. 60/874,484, filed on Dec. 13, 2006.

(51) Int. Cl.
*H01L 27/28* (2006.01)
*H01L 51/42* (2006.01)

(52) U.S. Cl. .............. 438/82; 438/99; 257/E31.119

(58) Field of Classification Search ............ 438/82, 438/99; 257/E31.119, E51.001, E51.026, 257/40

See application file for complete search history.

(56) References Cited

U.S. PATENT DOCUMENTS

| 5,708,099 | A | * | 1/1998 | Kushibiki et al. | 525/477 |
| 6,147,159 | A | * | 11/2000 | Hu et al. | 506/32 |
| 7,417,104 | B2 | * | 8/2008 | Iwabuchi et al. | 528/21 |
| 2006/0145306 | A1 | * | 7/2006 | Lee et al. | 257/643 |
| 2006/0159938 | A1 | * | 7/2006 | Lee et al. | 428/447 |

OTHER PUBLICATIONS

Barrie et al., "Formation and Characterization of Novel Organodisilicate Glasses", Chemistry of Materials (1995): pp. 265-270.*
Shea et al., "Arylsilsesquioxane Gels and Related Materials. New Hybrids of Organic and Inorganic Networks", Journal of the American Chemical Society (1992): pp. 6700-6710.*

* cited by examiner

*Primary Examiner*—Matthew Smith
*Assistant Examiner*—Michele Fan
(74) *Attorney, Agent, or Firm*—Kubovcik & Kubovcik

(57) ABSTRACT

A method of producing a polymer composition for semiconductor optoelectronics, comprising the steps of providing at least one type of disilane monomer which is homo- or copolymerized to form a (co)polymer and then combined with nanoparticles to provide a polymer composition. The nanoparticle containing composition has excellent properties with high refractive index or dielectric constant.

19 Claims, 3 Drawing Sheets

NANOPARTICLE CONTAINING SILOXANE POLYMERS

This application claims priority of U.S. Provisional Application for Patent Ser. No. 60/874,484 filed Dec. 13, 2006, which is incorporated herein by reference.

BACKGROUND OF THE INVENTION

1. Field of the Invention

The present invention relates to novel organo functionalized silane precursors and nanoparticle doped polymers of the same that are applicable for thin films used for example as dielectrics in integrated circuits, optoelectronic applications and for other similar applications. The invention also concerns a method for producing such films by preparing siloxane compositions by polymerization of the organo functionalized monomers, by applying the polymerized compositions on a substrate in the form of a layer and by curing the layer to form a film. Further, the invention concerns integrated circuit and optoelectronic devices and methods of manufacturing them.

2. Description of Related Art

The commercial use of electronic image sensors in electronics and, in particular in consumer electronics, has increased dramatically over the last few years. Electronic image sensors are found in cameras, cell phones, and are used for new safety features in automobiles e.g. for estimating distances between vehicles, protecting and detecting blind spots not exposed by mirrors etc. Many semiconductor manufacturers are converting production lines to CMOS sensor production to meet this demand. CMOS sensor manufacturing uses many of the processes currently used in standard IC manufacturing and does not require large capital investment to produce state of the art devices.

Processing from the bottom up a photodiode is built in the silicon layer. Standard dielectrics and metal circuitry are built above the diode to transfer the current. Directly above the diode is an optically transparent material to transfer light from the device surface and through a color filter to the active photo-diode. Transparent protection and planarization material is typically placed over the color filters and device. The micro-lenses are built over the planarized layer above the color filters in order to improve device performance. Finally a passivation layer maybe placed over the lens or alternatively a glass slide is placed over the lens array leaving an air gap between the lens and the cover. Most CMOS sensors are built using subtractive aluminum/CVD oxide metallization with one or more levels of metal. For the manufacturing of planarizing layer or micro-lenses are also used organic polymers such as polyimide or novolac materials or maybe sometimes siloxane polymers.

Organic polymers can be divided into two different groups with respect to the behavior of their dielectric constant. Non-polar polymers contain molecules with almost purely covalent bonds. Since they mainly consist of non-polar C—C bonds, the dielectric constant can be estimated using only density and chemical composition. Polar polymers do not have low loss, but rather contain atoms of different electronegativity, which give rise to an asymmetric charge distribution. Thus polar polymers have higher dielectric loss and a dielectric constant, which depends on the frequency and temperature at which they are evaluated. Several organic polymers have been developed for dielectric purposes. However, applicability of these films is limited because of their low thermal stability, softness, and incompatibility with traditional technological processes developed for $SiO_2$ based dielectrics. For example, organic polymer cannot be chemical mechanical polished or etched back by dry processing without damaging the film.

Therefore some of recent focus has been on SSQ (silsesquioxane or siloxane) or silica based dielectric and optical materials. For SSQ based materials, silsesquioxane (siloxane) is the elementary unit. Silsesquioxanes, or T-resins, are organic-inorganic hybrid polymers with the empirical formula $(R—SiO_{3/2})_n$. The most common representative of these materials comprise a ladder-type structure, and a cage structure containing eight silicon atoms placed at the vertices of a cube ($T_8$ cube) on silicon can include hydrogen, alkyl, alkenyl, alkoxy, and aryl. Many silsesquioxanes have reasonably good solubility in common organic solvents due to their organic substitution on Si. The organic substitutes provide low density and low dielectric constant matrix material. The lower dielectric constant of the matrix material is also attributed to a low polarizability of the Si—R bond in comparison with the Si—O bond in $SiO_2$. The silsesquioxane based materials for microelectronic application are mainly hydrogen-silsesquioxane, HSQ, and methyl-silsesquioxane, $(CH_3—SiO_{3/2})_n$, (MSQ). MSQ materials have a lower dielectric constant as compared to HSQ because of the larger size of the $CH_3$ group ~2.8 and 3.0-3.2, respectively and lower polarizability of the Si—$CH_3$ bond as compared to Si—H. However, these films index of refraction at visible range typically around 1.4 to 1.5 and always less than 1.6.

The silica-based materials have the tetrahedral basic structure of $SiO_2$. Silica has a molecular structure in which each Si atom is bonded to four oxygen atoms. Each silicon atom is at the center of a regular tetrahedron of oxygen atoms, i.e., it forms bridging crosslinks. All pure of silica have dense structures and high chemical and excellent thermal stability. For example, amorphous silica films, used in microelectronics, have a density of 2.1 to 2.2 $g/cm^3$. However, their dielectric constant is also high ranging from 4.0 to 4.2 due to high frequency dispersion of the dielectric constant which is related to the high polarizability of the Si—O bonds. Therefore, it is necessary to replace one or more Si—O—Si bridging groups with C-containing organic groups, such as $CH_3$ groups, which lowers the k-value. However, these organic units reduce the degrees of bridging crosslinks as well increases the free volume between the molecules due to steric hindrance. Therefore, their mechanic strength (Young's modulus <6 GPa) and chemical resistance is reduced compared to tetrahedral silicon dioxide. Also, these methyl-based silicate and SSQ (i.e., MSQ) polymers have relatively low cracking threshold, typically on the order of 1 um or less.

SUMMARY OF THE INVENTION

It is an object of the present invention to provide a novel siloxane polymers compatible with traditional Integrated Circuit (IC) processing and CMOS image sensor applications and having high index of refraction and or dielectric index optionally even in combination with reduced (or even eliminated) phase separation.

It is another object to provide a method of modifying the monomer sodas to form a novel organo-functionalized molecule.

It is a third object of the invention to provide methods of producing poly(organo siloxane) compositions, which are suitable for the preparation of thin films having excellent dielectric properties and optical properties.

It is a fourth object of the invention, to provide novel thin films, having low dielectric constant, excellent mechanical and thermal properties, said films being formed by the above-mentioned polymer.

It is a fifth object of the invention to provide dielectric layers on silicon and glass wafers.

These and other objects, together with the advantages thereof over the known dielectric thin films and methods for the preparation thereof, which shall become apparent from specification which follows, are accomplished by the invention as hereinafter described and claimed.

In order to achieve these objectives, the present invention provides novel polyorgano silsesquioxane materials, which are based on multisilane molecules and further doped metal oxide, metal or semiconducting nanoparticles, and useful as interlayer insulating films for semiconductor or optoelectronic devices, are introduced.

According to the invention, it is possible to proceed by first making an intermediate monomer and then converting the monomer to an organo functionalized silane monomer and finally forming a nanoparticle containing polymer or polymer compositions of the functionalized monomers and nanoparticles.

A method according to the present invention for producing a polymer composition for semiconductor optoelectronics, comprises the steps of providing a monomer having the formula:

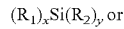

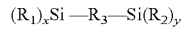

wherein:
R$_1$ is a hydrolysable group
R$_2$ is a functional organic group,
R$_3$ is an optional bridging linear or branched bivalent hydrocarbyl group, and x and y are integers from 1 to 3, homo- or copolymerizing the monomer to produce a polymer and combining the polymer with nanoparticles to provide a polymer composition.

Thus, generally, the monomer of the novel materials comprises at least two metal atoms, which are interconnected by a bridging hydrocarbyl radical and which exhibit hydrolysable substitutents on both of the metal atoms along with at least one organic group which is capable of reducing the polarizability of the polymer, further cross-linking the polymer, forming nanometer size porosity to the polymer or combination of all previous properties formed from the monomer.

In particular, the metal atoms are silicon atoms, and the bridging radical is a linear or branched (bivalent) hydrocarbyl group which links the two silicon atoms together. Furthermore, typically one of the silicon atoms contains three hydrolysable groups and the other silicon atom contains two hydrolysable groups and an organic cross-linking group, reactive cleaving group or polarizability reducing organic group, such as an alkyl, alkenyl, alkynyl, aryl, polycyclic group or organic containing silicon group. The latter group may also be fully or partially fluorinated.

The polymer of the present invention is produced by hydrolysing the hydrolysable groups of the multisilane monomer or a combination of the polymer described in the invention or a combination of molecules of the invention and molecules known in the art and then further polymerising it by a condensation polymerisation process.

The new material can be used as an optical dielectric film in an object comprising e.g. a (silicon) wafer.

The present invention also provides a method of forming a thin film having a dielectric constant of 4.0 or less or more preferably 3.5 or less and index of refraction more than 1.58 or preferably more than 1.60 at 632.8 nm wavelength range, comprising a monomer having the formula I, to form a siloxane material, depositing the siloxane material in the form of a thin layer; and curing the thin layer to form a film.

By incorporating nanoparticles into the materials comprising a disilane structure having optionally functional groups the refractive index which is already high compared with conventional siloxane materials (about 1.65 compared to <1.5) can be even improved and values in the range of up to 1.75 or even higher can be attained which makes the novel materials particularly attractive for CMOS camera applications.

Further advantages are obtained by the present novel materials and by the methods of manufacturing them. Thus, the present invention presents a solution for existing problems related to optical dielectric polymers, more specifically index of refraction, CMP compatibility, mechanical properties (modulus and hardness), cracking threshold and thermal properties, also applicable to IC integration temperatures. The film is also particularly applicable to light or radiation (preferably UV wavelength or e-beam) enhanced curing, optionally carried out simultaneously with the thermal curing process.

The novel organo-functionalized molecule can be built into such a form that it is capable of further reacting in the matrix. This means, for example, that the organic function of the molecule can undergo cross-linking, cleaving or combination of both, i.e., subsequent cleaving and cross-linking reactions.

The present invention provides excellent chemical resistance and very low chemical adsorption behavior due to high cross-linking bridging group density.

If the R$_2$ group is a leaving group, still very small pore size is resulted in, i.e., typically 1.5 nm or less. However, the polymer formed according to innovation is also compatible with traditional type porogens, such as cyclodextrin which can be used to form micro-porosity into the polymer and, thus, reduce the dielectric constant of the polymer.

Another important advantages is that the novel optical dielectric materials have excellent properties of planarization resulting in excellent local and global planarity on top a semiconductor substrate topography, which reduces or even fully eliminates the need for chemical mechanical planarization after dielectric and oxide liner deposition.

Furthermore, the novel materials have excellent gap fill properties.

In summary, the present invention provides an optical dielectric siloxane polymer applicable to forming thermally and mechanically stable, high index of refraction, dense dielectric films exhibiting high-cracking threshold, low pore volume and pore size. The polymer will give a non-aqueous and silanol free film with excellent local and global planarization as well as gap fill after subjected to thermal treatment with having excellent electrical and optical properties. A film made out of the novel polymer remains structurally, mechanically and electrically unchanged after final cure even if subjected to temperatures higher than the final cure temperature. All these properties, as they are superior over conventional optical dielectric polymers, are crucial to overcome existing problems as well as in order to improve device performance in optical dielectric film integration to a optical semiconductor device.

Next, the invention will be examined more closely by means of the following detailed description and with reference to a number of working examples.

DETAILED DESCRIPTION OF THE INVENTION

Figure 1:
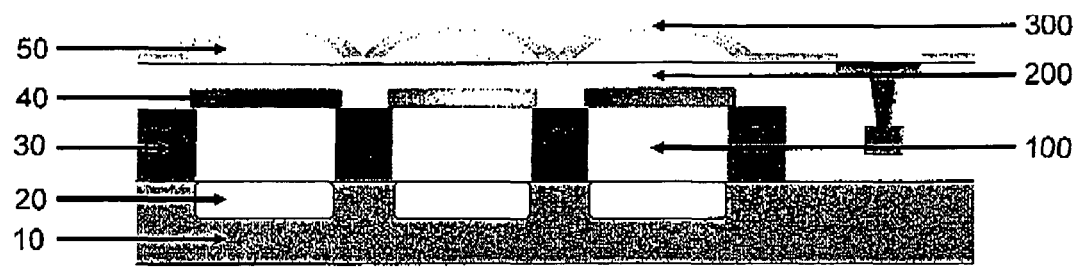
FIG. 1 shows a schematic cross-section of CMOS image sensor device.

The present invention provides an optical dielectric polymer comprising at least one multisilane mononer unit with at least one organic bridging group between silicon atoms. In addition, one of the silicon atoms also contains one organic cross-linking group, reactive cleaving group, index of refraction increasing group, UV blocking group, polarizability reducing organic group or a combination of all previous such as an alkyl, alkenyl, alkynyl, aryl, polyaromatic, polycyclic group or organic containing silicon group.

One of the silicon atoms comprises two hydrolysable groups and the other three hydrolysable groups capable of forming a continuous siloxane backbone matrix once hydrolyzed and polymerized, such as hydrogen, halide, alkoxy or acyloxy groups, but most preferably chlorine, methoxide or ethoxide groups or any of their combinations.

According to one preferred embodiment, the general formula I of the precursor used for polymerization in the present invention is the following:

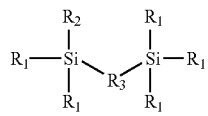

wherein:

$R_1$ is a hydrolysable group $R_2$ is an organic crosslinking group, reactive cleaving group, polarizability reducing organic group or combination of all previous, such as an alkyl, alkenyl, alkynyl, aryl, polycyclic group or organic containing silicon group, and $R_3$ is a bridging linear or branched bivalent hydrocarbyl group.

$R_1$ is preferably selected from the group of halides, alkoxy groups, acyloxy groups and hydrogen, $R_2$ is preferably selected from alkyl groups, alkenyl groups, alkynyl and aryl groups, polycyclic group or organic containing silicon group, and $R_3$ is preferably selected from linear and branched alkylene groups, alkenylene groups and alkynylene groups, and bivalent alicyclic groups (polycyclic groups) and bivalent aromatic groups which all are included in the definition of a bivalent hydrocarbyl group.

The cured composition obtained by essentially homopolymerizing monomers of the above formula, with subsequent curing to achieve cross-linking, comprises a cross-linked organosiloxane polymer, i.e. poly(organosiloxane). It can be formed into a thin film.

'Alkenyl' as used herein includes straight-chained and branched alkenyl groups, such as vinyl and allyl groups. The term 'alkynyl' as used herein includes straight-chained and branched alkynyl groups, suitably acetylene. 'Aryl' means a mono-, bi-, or more cyclic aromatic carbocyclic group, substituted or non-substituted; examples of aryl are phenyl, naphthyl, or pentafluorophenyl propyl. 'polycyclic' group used herein includes for example adamantyl, dimethyl adamantyl propyl, norbornyl or norbornene. More specifically, the alkyl, alkenyl or alkynyl may be linear or branched.

Alkyl contains preferably 1 to 18, more preferably 1 to 14 and particularly preferred 1 to 12 carbon atoms. The alkyl is preferably branched at the alpha or beta position with one and more, preferably two, $C_1$ to $C_6$ alkyl groups, especially preferred halogenated, in particular partially or fully fluorinated or per-fluorinated alkyl, alkenyl or alkynyl groups. Some examples are non-fluorinated, partially fluorinated and perfluorinated i-propyl, t-butyl, but-2-yl, 2-methylbut-2-yl, and 1,2-dimethylbut-2-yl. In particular, the alkyl group is a lower alkyl containing 1 to 6 carbon atoms, which optionally bears 1 to 3 substituents selected from methyl and halogen. Methyl, ethyl, n-propyl, i-propyl, n-butyl, i-butyl and t-butyl are particularly preferred.

Alkenyl contains preferably 2 to 18, more preferably 2 to 14 and particularly preferred 2 to 12 carbon atoms. The ethylenic, i.e. two carbon atoms bonded with double bond, group is preferably located at the position 2 or higher, related to the Si or M atom in the molecule. Branched alkenyl is preferably branched at the alpha or beta position with one and more, preferably two, $C_1$ to $C_6$ alkyl, alkenyl or alkynyl groups, particularly preferred fluorinated or per-fluorinated alkyl, alkenyl or alkynyl groups.

Alkynyl contains preferably 3 to 18, more preferably 3 to 14 and particularly preferred 3 to 12 carbon atoms. The ethylinic group, i.e. two carbon atoms bonded with triple bond, group is preferably located at the position 2 or higher, related to the Si or M atom in the molecule. Branched alkynyl is preferably branched at the alpha or beta position with one and more, preferably two, $C_1$ to $C_6$ alkyl, alkenyl or alkynyl groups, particularly preferred per-fluorinated alkyl, alkenyl or alkynyl groups.

The bivalent alicyclic groups may be polycyclic aliphatic groups including residues derived from ring structures having 5 to 20 carbon atoms, such as norbornene (norbornenyl) and adamantyl (adamantylene). "Arylene" stands for bivalent aryls comprising 1 to 6 rings, preferably 1 to 6, and in particular 1 to 5, fused rings, such as phenylene, naphthylene and anthracenyl.

The aryl group is preferably phenyl, which optionally bears 1 to 5 substituents selected from halogen, alkyl or alkenyl on the ring, or naphthyl, which optionally bear 1 to 11 substituents selected from halogen alkyl or alkenyl on the ring structure, the substituents being optionally fluorinated (including per-fluorinated or partially fluorinated)

The polycyclic group is for example adamantyl, dimethyl adamantyl propyl, norbornyl or norbornene, which optionally bear 1-8 substituents or can be also optionally 'spaced' from the silicon atom by alkyl, alkenyl, alkynyl or aryl groups containing 1-12 carbons.

"Hydrolysable group" stands for halogen (chlorine, fluorine, bromine), alkoxy (in particular $C_{1-10}$ alkoxy, such as methoxy, ethoxy, propoxy, or butoxy), acyloxy, hydrogen or any other group that can easily be cleaved off the monomer during polymerization, e.g. condensation polymerization.

The alkoxy groups stand generally for a group having the formula $R_4O-$, wherein $R_4$ stands for an alkyl as defined above. The alkyl residue of the alkoxy groups can be linear or branched. Typically, the alkoxy groups are comprised of lower alkoxy groups having 1 to 6 carbon atoms, such as methoxy, ethoxy and t-butoxy groups.

The acyloxy groups have the general formula $R_5O_2-$, wherein $R_5$ stands for an alkyl as defined above. In particular, the alkyl residue of the acyloxy group can have the same meanings as the corresponding residue in the alkoxy group.

In the context of the disclosure the organic group substituent halogen may be a F, Cl, Br or I atom and is preferably F or Cl. Generally, term 'halogen' herein means a fluorine, chlorine, bromine or iodine atom.

In the monomer of formula I, the silicon atoms are linked to each other via a linker group. Typically, the linker comprises 1 to 20, preferably about 1 to 10, carbon atoms. Examples of suitable linker groups $R_3$ include alkylene, alkenylene and alkynylene groups. "Alkylene" groups generally have the formula —$(CH_2)_r$— in which r is an integer 1 to 10. One or both of the hydrogens of at least one unit —$CH_2$— can be substituted by any of the substituents mentioned below. The "alkenylene" groups correspond to alkylene residues, which contain at least one double bond in the hydrocarbon backbone. If there are several double bonds, they are preferably conjugated. "Alkynylene" groups, by contrast, contain at least one triple bond in the hydrocarbon backbone corresponding to the alkylene residues.

The bivalent linker residue can be unsubstituted or substituted. The substitutents are preferably selected from the group of fluoro, bromo, $C_{1-10}$-alkyl, $C_{1-10}$-alkenyl, $C_{6-18}$-aryl, acryl, epoxy, carboxyl and carbonyl groups. A particularly interesting alternative is comprised of methylene groups substituted with at least one alkyl group, preferably a lower alkyl group or 1 to 4 carbon atoms. As a result of the substitution, a branched linker chain is obtained. The branched linker chain, e.g. —$CH(CH_3)$— can contain in total as many carbon atoms as the corresponding linear, e.g. —$CH_2CH_2$—, even if some of the carbon atoms are located in the side chain, as shown below in connection with the working examples. Such molecules can be considered "isomeric", for the purpose of the present invention.

As examples of a particularly preferred compounds according to formula I, 1-(trichlorosilyl)-2-(methyldichlorosilyl)ethane and 1-(methyldichlorosilyl)-1-(trichlorosilyl)ethane can be mentioned.

As mentioned above, in a first step of the method according to the present invention, a monomer is produced having the formula:

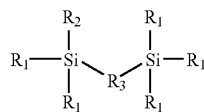

wherein:
$R_1$ is a hydrolysable group
$R_2$ is hydrogen, and
$R_3$ is a bridging linear or branched bivalent hydrocarbyl group.

This monomer and similar silane-based materials can be produced by hydrosilylation, which is carried out in the presence of cobalt octacarbonyl as a catalyst.

In particular, the novel hydrosilylation reaction catalyzed in the presence of cobalt octacarbonyl or, generally, any similar transition metal octate catalyst, is using halosilanes as reactants. Thus, in order to produce, at high yield, a compound of the formula above, in which $R_2$ stands for hydrogen, a first trihalogenated silane compound can be reacted with a second dihalogenated silane compound in the present of cobalt octacarbonyl. The trihalosilane used typically has a reactive organic group comprising an unsaturated bond for facilitating the hydrosilylation reaction.

This reaction is illustrated below in Example 1, wherein vinyltrichlorosilane is reacted with dichlorosilane to form 1,1,1,4,4-pentachloro-1,4-disilabutane.

Surprisingly, by the method disclosed, the desired compound is obtained with high purity, which allows for the use of the monomer as a precursor for the following steps of the preparation of siloxane materials by incorporation of desired substitutents at the $R_2$ position.

The present invention provides an optical dielectric siloxane polymer applicable for forming thermally and mechanically stable, high index of refraction, optically transparent, high cracking threshold, dense and low pore volume and pore size dielectric film. The polymer results in water and silanol free film with excellent local and global planarization as well as gap fill after subjected to thermal treatment with having excellent electrical properties. A film made out of the invented polymer remains structurally, mechanically and electrically unchanged after final cure even if subjected to temperatures higher than the final cure temperature. All these properties, as they are superior over conventional low dielectric constant polymers, are crucial to overcome existing problems in low dielectric constant film integration to a semiconductor device.

The polymerization synthesis is based on hydrolysis and condensation chemistry synthesis technique. Polymerization can be carried out in melt phase or in liquid medium. The temperature is in the range of about 20 to 200° C., typically about 25 to 160° C., in particular about 80 to 150° C. Generally polymerization is carried out at ambient pressure and the maximum temperature is set by the boiling point of any solvent used. Polymerization can be carried out at refluxing conditions. It is possible to polymerize the instant monomers without catalysts or by using alkaline or, in particular, acidic catalysts.

The present organosiloxane materials have a (weight average) molecular weight of from 500 to 100,000 g/mol. The molecular weight can be in the lower end of this range (e.g., from 500 to 10,000 g/mol, or more preferably 500 to 8,000 g/mol) or the organosiloxane material can have a molecular weight in the upper end of this range (such as from 10,000 to 100,000 g/mol or more preferably from 15,000 to 50,000 g/mol). It may be desirable to mix a polymer organosiloxane material having a lower molecular weight with a organosiloxane material having a higher molecular weight.

We have found that a suitable polymer composition can be obtained by homopolymerizing a monomer of formula I comprising either a linear or a branched linker group. However, it is also possible to provide a composition that is obtained by copolymerizing first monomers having formula I, wherein $R_3$ stands for a linear bivalent hydrocarbyl residue, with second monomers having formula I, wherein $R_3$ stands for a branched bivalent hydrocarbyl residue, the molar ratio of the first monomers to the second monomers is 95:5 to 5:95, in particular 90:10 to 10:90, preferably 80:20 to 20:80. Furthermore, the monomers of formula I can be also co-polymerized with any know hydrolysable siloxane or organo-metallic (e.g. titanium alkoxide, titanium chloride, zirconium alkoxide, zirconium chloride, tantalum alkoxide, tantalum chloride, aluminum alkoxide or aluminum chloride but not limited to these) monomer in any ratio.

According to one embodiment, the polymeric materials of the invention preferably comprise ordered copolymers of the above kind.

One specific method according to the invention of producing a thin film for optoelectronics comprises depositing on a semiconductor substrate a film obtainable by polymerization of at least one organo functionalized monomer having the formula:

$(R_1)_x Si(R_2)_y$ 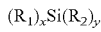 Ia or $(R_1)_x Si-R_3-Si(R_2)_y$ 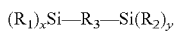 IIa or mixtures thereof wherein:
$R_1$ is a hydrolysable group
$R_2$ is a functional organic group,
$R_3$ is an optional bridging linear or branched bivalent hydrocarbyl group, and
x and y are integers from 1 to 3, said polymer being produced by homo- or copolymerizing the monomer to produce a polymer which is then further contacted with nanoparticles to form a polymer composition, which is applied on a substrate in the form of a layer and cured to form a film.

In particular, a thin film can be produced by using monomers of the above formula, wherein independently
$R_1$ is selected from the group of hydrogen, halides, alkoxy and acyloxy groups,
$R_2$ is selected from alkyl groups, alkenyl groups and aryl groups, and
$R_3$ is selected from linear and branched alkylene groups, alkenylene groups, alkynylene groups, bivalent alicyclic groups, bivalent polycyclic groups, and bivalent aromatic groups, and such a monomer can be homopolymerized or copolymerized—in the latter case preferably with another monomer of either formula Ia or IIa.

According to another preferred embodiment, in order to modify the properties, the siloxane material deposited on a substrate of a semiconductor device is heated to cause further cross-linking, whereby a film is obtained, having a shrinkage after heating of less than 10%, preferably less than 5%, in particular less than 2%, and a thermal stability of more 425° C.

According to a particular embodiment, the film is baked after spin coating at a temperature below about 200° C. and then cured by exposure to UV radiation simultaneously with a thermal treatment at a temperature below 450° C. for 0.1 to 20 minutes. The curing is carried out for a sufficient period of time for reacting the organic substituent at position $R_2$ of the unit derived from a monomer having the formula I above.

The polymer of the present invention is capable of forming low dielectric films having a dielectric constant of 4.0 or less, in particular 3.5 or less, index of refraction 1.58 or more, in particular 1.60 or more at 632.8 nm wavelength range, a Young's modulus of 5.0 GPa or more, a porosity of 5% or less and cracking threshold of 1 um or more after subjected to thermal treatment. Also the film formed from the polymer using a multisilane component remains stable on a semiconductor structure at temperatures up to 400° C. or more.

As mentioned above, the present invention also provides methods of producing integrated circuit devices. Such methods typically comprise the steps of:
forming a plurality of transistors on a semiconductor substrate;
forming multilayer interconnects by:
depositing a layer of metal;
patterning the metal layer;
depositing a first dielectric material having a first modulus and a first k value;
depositing a second dielectric material having a second modulus higher than the first modulus of the first material and with a k value lower than the first k value of the first material; and
patterning the first and second dielectric materials and depositing a via filling metal material into the patterned areas.

The material according to the invention used for the first dielectric layer is preferably an organosiloxane material, which has a repeating -M-O-M-O- backbone having a first organic substituent bound to the backbone, the material having a molecular weight of from 500 to 100,000 g/mol, where M is silicon and O is oxygen. The molecular weight is from 1500 to 30,000 g/mol, and it preferably exhibits one or several of the following properties:
a k value of 4.0 or less or even more preferably 3.5 or less,
an index of refraction of 1.58 or more or even more preferably 1.6 or more
a CTE 30 ppm or less, and
Young's modulus 4 GPa or more.

Due to the excellent properties of planarization, the patterning step can be carried out without a preceding step of chemical mechanical planarization. Alternatively, 45% or less of the total thickness of the second dielectric material is removed by performing chemical mechanical planarization on the second dielectric material.

The organosiloxane material can be deposited by polymerizing a monomer of formula I in a liquid medium formed by a first solvent to form a hydrolyzed product comprising a siloxane material; depositing the hydrolyzed product on the substrate as a thin layer; and curing the thin layer to form a thin film having a thickness of 0.01 to 10 um.

Alternatively, the organosiloxane material can be deposited by polymerizing a monomer of formula I with any know hydrolysable siloxane or organo-metallic (e.g. titanium alkoxide, titanium chloride, zirconium alkoxide, zirconium chloride, tantalum alkoxide, tantalum chloride, aluminum alkoxide or aluminum chloride but not limited to these) monomer in a liquid medium formed by a first solvent to form a hydrolyzed product comprising a siloxane material or hybrid siloxane-organo-metallic material; depositing the hydrolyzed product on the substrate as a thin layer; and curing the thin layer to form a thin film having a thickness of 0.01 to 10 um.

Whereas one of the dielectric materials comprises a material in accordance with the present invention, the other material can be a known, organic, inorganic, or organic/inorganic material, e.g. of the kind discussed above in the introductory portion of the description.

Generally, the organosiloxane material is a spin or slit coated material.

The organosiloxane material is an organic-inorganic and has a coefficient of thermal expansion of 12 to 30 ppm. It can have an index of refraction of 1.6 or less. However, higher index of refraction can be achieved via attaching polyaromatic chemical groups to the siloxane matrix.

The siloxane matrix can further be modified with nanoparticle doping. These nanoparticles include oxide, semiconductor and metal nanoparticles. It is beneficial to chemically dope siloxane matrices with nanoparticles in order to improve or change siloxane polymers' properties such as optical, electrical and mechanical properties. Nanoparticles can be modified on the surface by coupling chemical groups. These chemical coupling groups are typically so called silane-coupling groups but are not limited to those. Silane coupling elements are for example amino propyl trimethoxysilane, methacryloxy propyl trimethoxysilane or glysidoxy propyl trimethoxysilane and other similar groups having a silane residue which is coupled to functional groups. One advantage of using coupling treated nanoparticles is that it enhances the particles solubility to siloxane matrices and can also enable the particle covalent bonding to the siloxane matrix. The number of coupling elements can also vary at the surface of the nanoparticle. The relative amount of the linkers can be 1 or higher and typically it is preferable to have more than one linker molecule at the surface in order to secure sufficient bonding to the polymer matrix.

Typically, the polymer or copolymer is combined with 1 to 500 parts by weight, preferably about 5 to 100 parts by weight, in particular about 10 to 50 parts by weight of nanoparticles with 100 parts by weight of the polymer or copolymer to form a nanoparticle containing composition.

The polymer or copolymer can be combined with the nanoparticles by blending, in particular conventional mechanical blending.

It is also possible to combine the polymer or copolymer with nanoparticles in such a way that some bonds, preferably chemical bonds, are formed between the polymers or copolymers and the nanoparticles. Thus, it is possible to use polymers or copolymers having reactive groups capable of reacting with the nanoparticles and forming a bond between the polymer or copolymer and the nanoparticles. It is also possible to use nanoparticles having silane coupling elements or groups, as discussed above. Physical bonding between the components will also enhance the mechanical, optical and electrical properties of the composition.

One embodiment comprises using chemically bonded nanoparticles and a blend of distinct polymers wherein the blend of distinct polymers comprises an ordered copolymer. The nanoparticles are bonded to at least one polymer component of the blend.

Nanoparticles suitable for use in the present invention can be manufactured, for example, by a method selected from the group of base or acid solution chemical methods, flame hydrolysis, laser densification and combinations of two or more of these methods. This list is, however, in no way limiting on the scope of the present invention. Any method that will yield particles having the desired particles sizes can be used. The particle size (average particle size) can be from 1 nm range up to several micrometers, yet typically in optical and IC applications it is preferable to have a particle size of 20 nm or less, in particular about 0.5 to 18 nm. Also narrow particle size distribution is preferred but not required.

Typical materials of the nanoparticles to be doped to the organo-siloxane matrix include, but is not limited to, the following groups:
Metals: Fe, Ag, Ni, Co, Cu, Pt, Bi, Si and metal alloys.
Metal oxides: $TiO_2$, ZnO, $Ta_2O_5$, $Nb_2O_5$, $SnO_2$, $ZrO_2$, $MgO_2$, $Er_2O_3$ and $SiO_2$.
Carbides: SiC.
Nitrides: $Si_3N_4$, AlN and TiN.

Suitable nanoparticle materials are discussed in US Published Patent Application No. 2005/0170192, the content of which is herewith incorporated by reference.

Nanoparticles are typically used in the form of dispersions ("dispersion solutions"). Suitable dispersants include, for example, water, organic solvents, such as alcohols and hydrocarbons, and combinations and mixtures thereof. The selection of preferred solvents generally depends on the properties of the nanoparticles. Thus, the dispersant and the nanoparticles should be selected so as to be compatible with the requirements for the formation of well dispersed particles. For example, gamma alumina particles are generally well dispersed at acidic pH values of about 3-4, silica particles generally are readily dispersed at basic pH values from 9-11, and titanium oxide particles generally disperse well at a pH near 7, although the preferred pH depends on the crystal structure and the surface structure. Generally, nanoparticles with little surface charge can be dispersed preferentially in less polar solvents.

Thus, hydrophobic particles can be dispersed in non-aqueous (water-free) solvents or aqueous solutions with less polar co-solvents, and hydrophilic particles can be dispersed in aqueous solvent.

In these nanoparticle solvent dispersions the particle surfaces can also be treated with silane coupling agents. The hydrolysable part of such coupling groups reacts spontaneously with the surface of the nanoparticle especially in the presence water as a hydrolyzation catalyst.

As the below examples will show, it is possible to increase the compatibility of the polymer towards aqueous dispersions of nanoparticles by incorporating suitable functional groups. In particular, at least a part of substituents $R_2$ can be or can contain at least one functional group capable of increasing such compatibility. $R_2$ can, for example, comprises a polar group. In one embodiment of the invention, $R_2$ is an aliphatic or aromatic residue comprising OH functionality. Such functionality can be incorporated by using monomers having epoxy groups which are then converted into diol groups by treating the material with a strong acid, such as a strong sulphonic acid such as trihalomethane sulfonic acid in water. The diol grouping typically comprises a carbon residue with 2 to 5 carbon atoms forming a backbone with two hydroxyl groups attached to carbon atoms of the residue.

Further details of the invention will be discussed in connection with the following working examples:

EXAMPLES

Example 1

1,1,1,4,4-Pentachloro-1,4-disilabutane (The Intermediate)

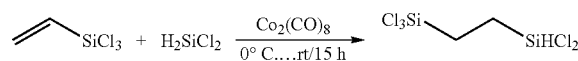

Vinyltrichlorosilane (68.8 g, 426 mmol) and cobalt octacarbonyl (700 mg) were placed in a 100 mL rb flask and cooled in an ice bath to 0° C. Dichlorosilane (bp. 8° C., 44.3 g, 439 mmol) was then condensed into the flask, The system was allowed to warm up to room temperature during night. Distillation at 60 . . . 62° C./8 mbar gave 1,1,1,4,4-Pentachloro-1,4-disilabutane (120.8 g, 460 mmol) in 93% yield.

Example 2

Tris(3,3,6,6,6-pentachloro-3,6-disilahexyl)chlorosilane

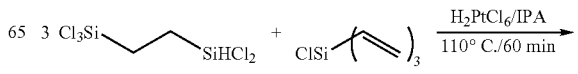

-continued

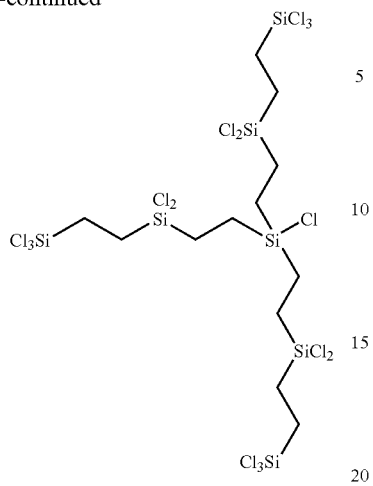

11.00 g (0.076 mol) trivinylchlorosilane was added to a 100 ml vessel followed by 2 ml 1,1,1,4,4-pentachloro-1,4-disilabutane. The solution was heated to 80° C. and 15 μL of a 10% H$_2$PtCl$_6$/IPA-solution was added. Strong exothermic reaction was observed and heat was switched off. Rest of 1,1,1,4,4-pentachloro-1,4-disilabutane was added slowly during 30 min keeping the temperature of the solution below 130° C. The total amount of 1,1,1,4,4-pentachloro-1,4-disilabutane was 61.50 g (0.234 mol, 2.6% excess). After addition heat was again switched on and solution was stirred for an hour at 110° C. After that solution was distilled yielding 47.08 g (66%) tris(3,3,6,6,6-pentachloro-3,6-disilahexyl)chlorosilane. B.p. 264° C./<0.5 mbar.

Example 3

1,1,1,4,4,7,7,7-Octachloro-1,4,7-trisilaheptane

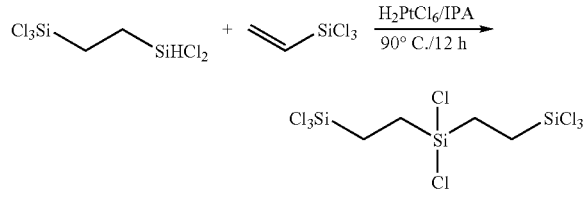

Vinyltrichlorosilane (16.8 g, 104 mmol) was heated to 60° C. and 100 μL 10% H$_2$PtCl$_6$/IPA-solution was added. 1,1,1,4,4-pentachloro-1,4-disilabutane (20.4 g, 77.7 mmol) was added slowly during 20 min so that the temperature did not exceed 100° C. The reaction was allowed to proceed for 12 hours at 100° C., after which it was distilled under vacuum at 115-130° C./<1 mbar. The yield was 31.5 g (74.3 mmol, 96%).

Example 4

1,1,1,4,4,7,7,7-Octachloro-1,4,7-trisilaoctane

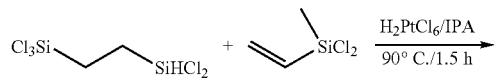

-continued

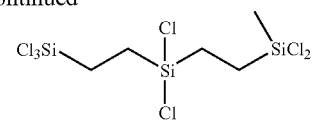

1,1,1,4,4-Pentachloro-1,4-disilabutane (51.6 g, 196 mmol) was heated to 80° C. and 20 μL 10% H$_2$PtCl$_6$/IPA-solution was added. Vinylmethyldichlorosilane (29.7 g, 210 mmol) was added slowly during 20 min so that the temperature did not exceed 130° C. The reaction was allowed to proceed for 1½ hours, after which it was distilled under vacuum at 90-102° C./<1 mbar. The yield was 70.2 g (174 mmol, 89%).

Examples 5 to 7

1,1,1,4,4-Pentachloro-1,4-disiladecane 1,1,1,4,4-Pentachloro-1,4-disiladodecane 1,1,1,4,4-Pentachloro-1,4-disilatetrakaidecane

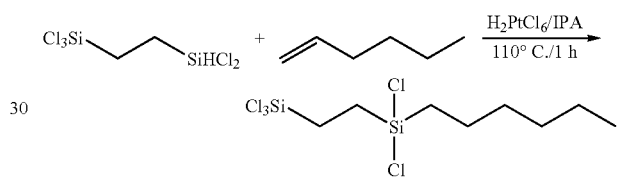

32 ml (21.53 g, 0.256 mol) 1-hexene and 20 μl H$_2$PtCl$_6$/IPA solution were added to a 100 ml vessel. Solution was heated up to 80° C. and 46.90 g (0.179 mol) 1,1,1,4,4-pentachloro-1,4-disilabutane was added slowly during 30 min. Heat was switched off when exothermic reaction was observed. Temperature during the addition was kept below 130° C. After addition heat was again switched on and solution was stirred for an hour at 110° C. After that product was purified by distillation. B.p. 100° C./0.8 mbar. Yield 50.40 g (81.4%).

1-hexene can be replaced by 1-octene or 1-decene to produce 1,1,1,4,4-pentachloro-1,4-disiladodecane (b.p. 131° C./0.7 mbar, 88% yield) and 1,1,1,4,4-pentachloro-1,4-disilatetrakaidecane (b.p. 138° C./0.8 mbar, 82% yield), respectively.

Example 8

1,1,1,4,4-Pentachloro-7-phenyl-1,4-disilaheptane

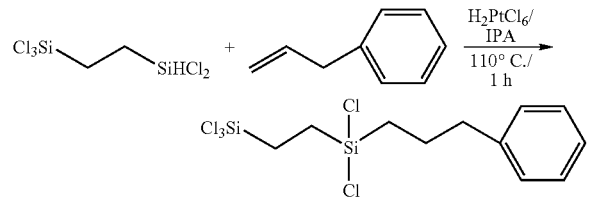

18.77 g (0.159 mol) allylbenzene and 50 μl H$_2$PtCl$_6$/IPA solution were added to a 100 ml vessel. Solution was heated up to 80° C. and 41.85 g (0.159 mol) 1,1,1,4,4-pentachloro- 1,4-disilabutane was added slowly during 30 min. Heat was switched off when exothermic reaction was observed. Temperature during the addition was kept below 130° C. After addition heat was again switched on and solution was stirred for an hour at 110° C. After that product was purified by distillation. B.p. 137° C./0.8 mbar. Yield 35.10 g (58%).

Example 9

1,1,1,4,4-Pentachloro-6-pentafluorophenyl-1,4-disilahexane

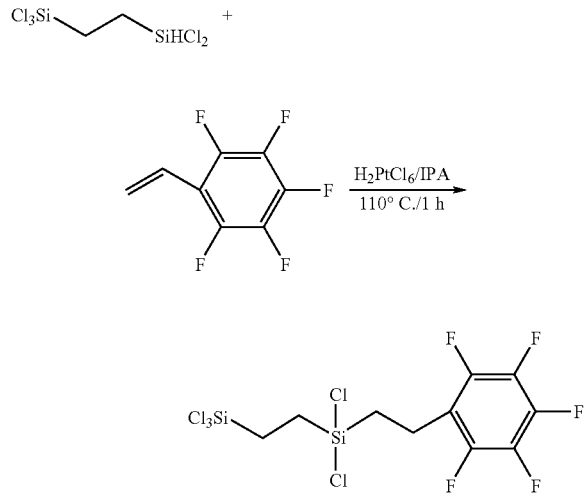

116.15 g (0.442 mol) 1,1,1,4,4-pentachloro-1,4-disilabutane was added to a 250 ml vessel followed by 100 μl $H_2PtCl_6$/IPA solution. Solution was heated up to 85° C. and 85.80 g (0.442 mol) pentafluorostyrene was added slowly during 30 min. After addition solution was stirred for an hour at 100° C. and then distilled. Bp. 122° C./<1 mbar, yield 158.50 g (78%).

Example 10

1,1,1,4,4-Pentachloro-1,4-disila-5-hexene

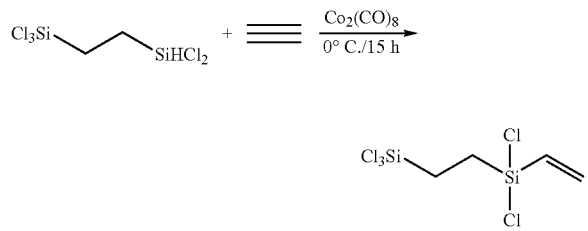

40.00 g (0.152 mol) 1,1,1,4,4-pentachloro-1,4-disilabutane was dissolved in 1000 ml 1,4-dioxane in a 2000 ml vessel. The solution was cooled down to 0° C. and acetylene was bubbled to solution until it was saturated. The solution thus obtained was slowly warmed up to room temperature. 1,4-dioxane was evaporated and obtained crude 1,1,1,4,4-pentachloro-1,4-disila-5-hexene was purified by distillation.

Example 11

1,1,1,4,4-Pentachloro-7-(3,5-dimethyladamantyl)-1,4-disilaheptane

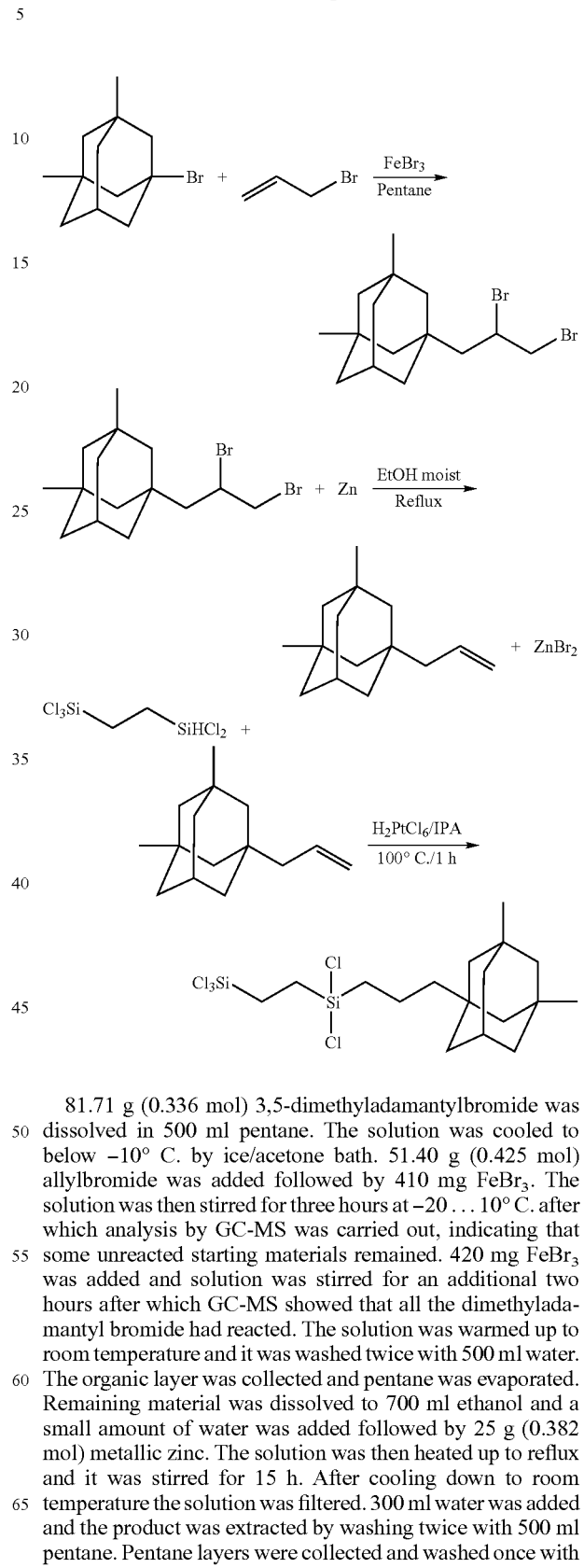

81.71 g (0.336 mol) 3,5-dimethyladamantylbromide was dissolved in 500 ml pentane. The solution was cooled to below −10° C. by ice/acetone bath. 51.40 g (0.425 mol) allylbromide was added followed by 410 mg $FeBr_3$. The solution was then stirred for three hours at −20 . . . 10° C. after which analysis by GC-MS was carried out, indicating that some unreacted starting materials remained. 420 mg $FeBr_3$ was added and solution was stirred for an additional two hours after which GC-MS showed that all the dimethyladamantyl bromide had reacted. The solution was warmed up to room temperature and it was washed twice with 500 ml water. The organic layer was collected and pentane was evaporated. Remaining material was dissolved to 700 ml ethanol and a small amount of water was added followed by 25 g (0.382 mol) metallic zinc. The solution was then heated up to reflux and it was stirred for 15 h. After cooling down to room temperature the solution was filtered. 300 ml water was added and the product was extracted by washing twice with 500 ml pentane. Pentane layers were collected and washed once with water. The organic layer were collected, dried with anhydrous magnesium sulfate and filtered. Pentane was evaporated and remaining crude 1-allyl-3,5-dimethyladamantane was purified by distillation, yield 45.90 g (67%). 1-allyl-3,5-dimethyladamantane was moved to a 100 ml vessel followed by 50 μl H$_2$PtCl$_6$/IPA solution. The solution was heated up to 85° C. and 59.50 g (0.227 mol) 1,1,1,4,4-pentachloro-1,4-disilabutane was added slowly during 30 min. After addition, the solution was heated up to 100° C. and it was stirred for an hour. The product thus obtained was then purified by distillation yielding 53.54 g (51%), bp. 157-158° C./<0.5 mbar.

Example 12

1,1,1,4,4-Pentachloro-5,6-dimethyl-1,4-disila-6-heptene

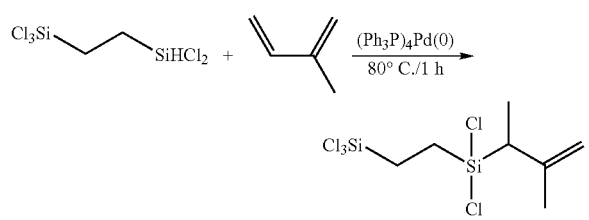

49.85 g (0.190 mol) 1,1,1,4,4-pentachloro-1,4-disilabutane was added to a 100 ml vessel followed by ~20-30 mg tetrakis(triphenylphosphine)palladium(0). The solution was heated to 80° C. and 13.10 g (0.192 mol) iso-prene was added slowly during 30 min. After addition, the solution was stirred for an hour at 100° C. and then distilled. Bp. 96° C./<1 mbar, yield 58.50 g (93%).

If the same reaction is carried out with a H$_2$PtCl$_6$/IPA catalyst at 80° C. or with a CO$_2$(CO)$_8$ catalyst at room temperature a 1:1 mixture of α and β substituted isomers is obtained.

Example 13

1,1,1,4,4-Pentachloro-6-(5-norborn-2-ene)-1,4-disilahexane

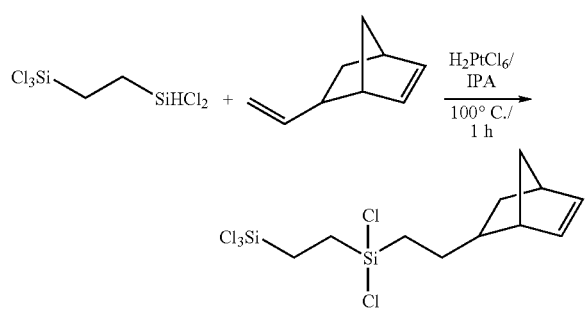

22.63 g (0.086 mol) 1,1,1,4,4-pentachloro-1,4-disilabutane was added to a 100 ml vessel followed by 70 μl of a H$_2$PtCl$_6$/IPA solution. The solution obtained was heated to 85° C. and 10.81 g (0.090 mol) 5-vinyl-2-norbornene was then slowly added during 30 min. After addition, the solution was stirred for an hour at 100° C. and then distilled. Bp. 140° C./<1 mbar, yield 20.05 g (61%).

Example 14

9-Phenanthrenyl triethoxysilane

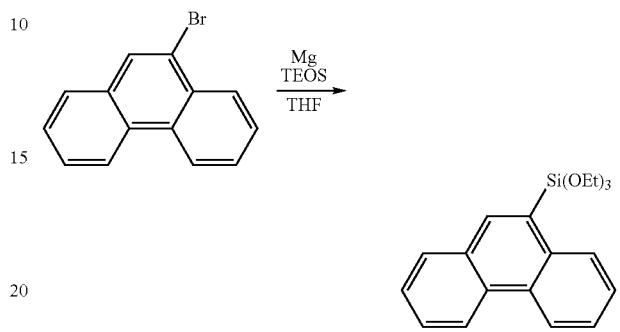

5.33 g (0.219 mol) magnesium and a small amount of iodine were added to a 1000 ml vessel followed by 56.38 g (0.219 mol) 9-bromophenanthrene. 196 ml (182.74 g, 0.877 mol) Si(OEt)$_4$ was added to the vessel. 200 ml THF was added after which exothermic reaction occurred. After the solution had cooled down it was heated up to reflux and was stirred for over night.

Refluxing was stopped and 300 ml n-heptane was added. Solution was decanted to an another vessel and remaining solid was washed twice with 200 ml n-heptane. The washing solutions were added to reaction solution. THF and n-heptane were evaporated, and the remaining material was distilled. B.p. 175° C./0.7 mbar. Yield was 52.63 g=70%.

Example 15

1-(9-Phenanthrenyl)-1,1,4,4,4-pentamethoxy-1,4-disilabutane

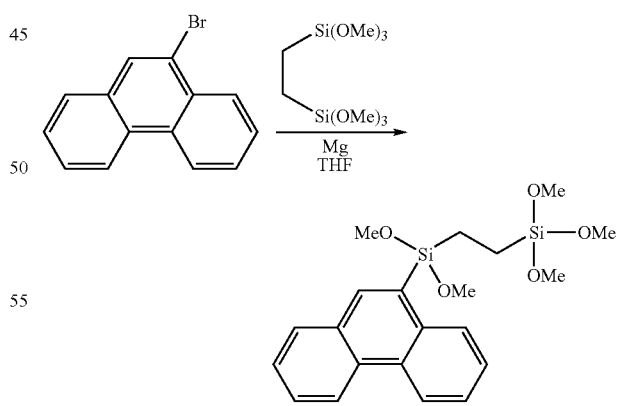

7.23 g (0.297 mol) magnesium and a small amount of iodine were added to a 1000 ml vessel followed by 56.38 g (0.219 mol) 9-bromophenanthrene. Bis(trimethoxysilyl)ethane (237 g, 0.876 mol) was added to the vessel, followed by 200 ml THF. In a few minutes, an exothermic reaction occurred. After the solution had cooled down it was heated up to reflux and was stirred for over night.

Refluxing was stopped and 300 ml n-heptane was added. Solution was decanted to an another vessel and remaining solid was washed twice with 200 ml n-heptane. The washing solutions were added to reaction solution. THF and n-heptane were evaporated, and the remaining material was distilled. B.p. 190-205° C./<0.1 mbar. Yield was 59.23 g=65%.

Example 16

3-(9-Phenanthrenyl)propyl trimethoxysilane

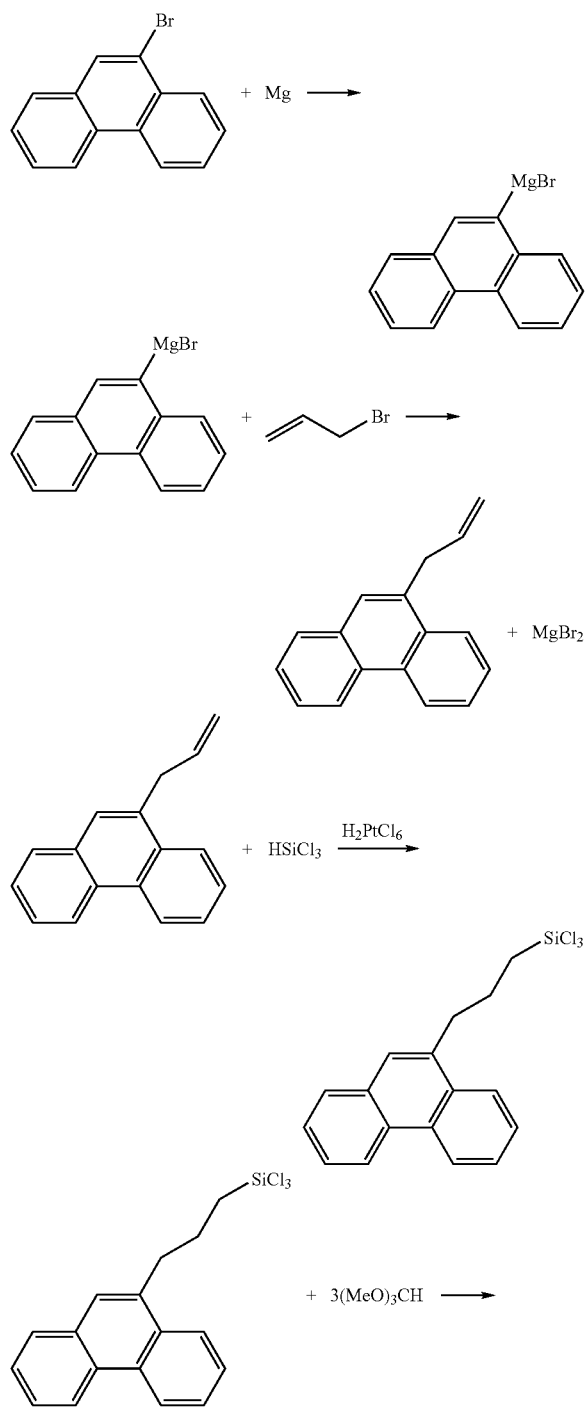

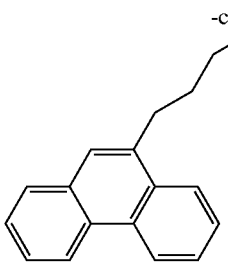
+ 3MeCl + 3MeOC(O)H 6.90 g (0.284 mol) magnesium powder and a few crystals of iodine were added to a 1000 ml vessel followed by 73.07 g (0.284 mol) 9-bromophenanthrene. 90 ml THF was added after which exothermic reaction occurred. While the solution had cooled down back to room temperature 30 ml THF was added and the solution was heated up to 65° C. and stirred for over night.

Solution was allowed to cool down to 50° C. and 34.42 g (0.285 mol) allylbromide was added dropwice during 30 min at a rate that kept solution gently refluxing. After addition solution was stirred for 2 hours at 65° C. Solution was cooled down to room temperature and most of THF was removed by vacuum. 700 ml DCM was added and solution moved to separation funnel. Solution was washed twice with 700 ml water. Organic layer was collected and dried with anhydrous magnesium sulfate. Solution was filtered followed by evaporation of solvents. Remained material was purified by distillation. B.p. 110-115° C./<0.5 mbar. Yield 54.5 g (88%).

Allylphenanthrene (41.59 g, 0.191 mol) was added to a 250 ml round bottomed flask and heated up to 90° C. 50 μl 10% $H_2PtCl_6$ in IPA was added. Addition of $HSiCl_3$ was started and exothermic reaction was observed. 26.59 g (0.196 mol) $HSiCl_3$ was added slowly during 40 min. After addition solution was stirred for an hour at 100° C. Excess $HSiCl_3$ was removed by vacuum and 100 ml (97 g, 0.914 mol) trimethyl orthoformate was added followed by 50 mg $Bu_4PCl$ as a catalyst. Solution was stirred for 90 hours at 70° C. and product was purified by distillation. B.p. 172° C./<0.5 mbar. Yield 50 g (74% based on amount of allylphenanthrene).

Example 17

High Index of Refraction Polymer 1

9-Phenanthrenyl triethoxysilane (15 g, 44 mmol), acetone (22.5 g) and 0.01M HCl (7.2 g, 400 mmol) were placed in a 100 mL rb flask and refluxed for 23 hours. The volatiles were evaporated under reduced pressure. White solid polymer (11.84 g) was obtained. The polymer was diluted in PGMEA (29.6 g, 250%) and then casted on a silicon wafer. Soft bake 150° C./5 min, followed by cure at 400° C./15 min. The index of refraction was 1.6680 at 632.8 nm wavelength range and dielectric constant 3.5 at 1 MHz. However, polymer did not have excellent chemical resistance against standard organic solvent and alkaline wet etch chemicals.

Example 18

High Index of Refraction Polymer 2

9-Phenanthrenyltriethoxysilane (17.00 g, 0.05 mol, prepared by Grignard reaction between 9-bromophenanthrene, magnesium, and tetraethoxysilane in THF) and acetone (15.00 g) were stirred until solids dissolved. Dilute nitric acid (0.01M HNO$_3$, 6.77 g, 0.38 mol) was then added. Two phases (water and organic) separated. The system was refluxed until the solution became clear (~15 min). Glycidyloxypropyltrimethoxysilane (3.00 g, 0.01) was added and the flask was refluxed for six hours. Volatiles were evaporated in rotary evaporator until 25.00 g polymer solution remained. N-Propyl acetate (32.50 g) was added and evaporation continued again until 27 g remained. Next, propylene glycol monomethyl ether acetate (30 g) was added and again evaporated until 24.84 g was left as viscous polymer. Amount of nonvolatiles was measured to be 69.24%. More PGMEA (8.89 g) was added so that solid content was ~50%. The solution was heated in oil bath (165° C.) and refluxed for 4 hours 20 minutes. The water that formed during the reaction was removed in rotary evaporator, along with PGMEA until 18 g remained. More PGMEA (42 g) was added to give solution with solid content 22.16%. Polymer had $M_n/M_w$=1,953/2,080 g/mol, as measured by GPC against monodisperse polystyrene standards in THF.

Sample preparation: The solution above (9.67 g) was formulated with PGMEA (5.33 g), surfactant (BYK-307 from BYK-Chemie, 4 mg) and cationic initiator (Rhodorsil 2074, 10 mg). It was spin-coated on a 4" wafer at 2,000 rpm. The film was soft baked at 130° C./5 mins and cured at 200° C./5 mins. Film thickness after cure was 310 nm and index of refraction of 1.66 at 632.8 nm and dielectric constant 3.4 at 1 MHz. The film did not dissolve with acetone, indicating that cross-linking had been successful. Similarly, a more concentrated PGMEA solution (solids 25%) was prepared, spun and cured. The film was 830 nm thick and had modulus 7.01 GPa and hardness 0.41 GPa as measured by nanoindentation.

Example 19

High Index of Refraction Polymer 3

Figure 2:
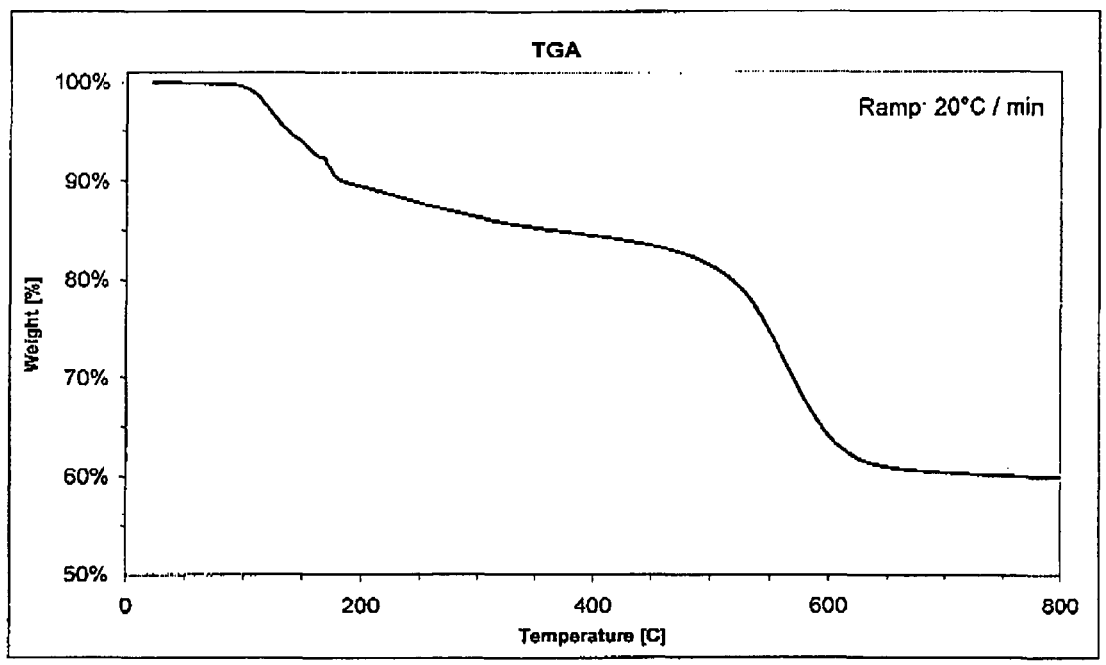
FIG. 2 shows the thermogravimetric diagram of high index of refraction Polymer 3.

1-(9-Phenanthrenyl)-1,1,4,4,4-pentamethoxy-1,4-disilabutane (9.55 g, 22.9 mmol), 9-Phenanthrenyl triethoxysilane (9.02 g, 26.5 mmol) and SLSI-grade acetone (14.0 g) were placed in a 250 ml rb flask with a teflon coated magnetic stir bar. Distilled water (6.0 g, 333 mmol) was added and system was refluxed for 15 mins. Then, 2 drops of dil.HCl (3.7 w-% was dripped in. In two minutes the solution became homogenous, indicating the progress of hydrolysis. A solution of 1-(9-Phenanthrenyl)-1,1,4,4,4-pentamethoxy-1,4-disilabutane (11.45 g, 27.5 mmol) in acetone (16.0 g) was poured in, followed by 0.01M HCl solution (8.4 g, 466 mmol). The reaction was allowed to reflux for 14 hours. After the reflux, all volatiles were removed under vacuum, yielding 28.1 g dry polymer as clear colorless solids. It was thermally stable up to 500° C. in argon atmosphere, measured by TGA (FIG. 2.).

The solids were diluted in n-butyl acetate (NBA, 73.06 g, 260%) and surfactant (56 mg, BYK®-307 of Byk-Chemie). Alternatively, solutions in propylene glycol mono methyl ether acetate (PGMEA, 240%) and methyl ethyl ketone (MEK, 400%) were also prepared. The solution in NBA was filtered through a 0.2µ teflon filter, and spin casted on a 4" silicon wafer at 3000 rpm. Soft bake at 150° C./5 mins and 200° C./5 mins, followed by the cure at 400° C./15 mins in N$_2$ ambient gave film with index of refraction 1.6511 at 632.8 nm and thickness of 683 nm. The dielectric constant of the film was 3.4 at 1 MHz. Films with final thicknesses up to 1850 nm were prepared, and they showed no sign of cracking. The film could be rubbed with organic solvents such as acetone without damaging it.

Example 20

High Index of Refraction Polymer 4

Figure 3:
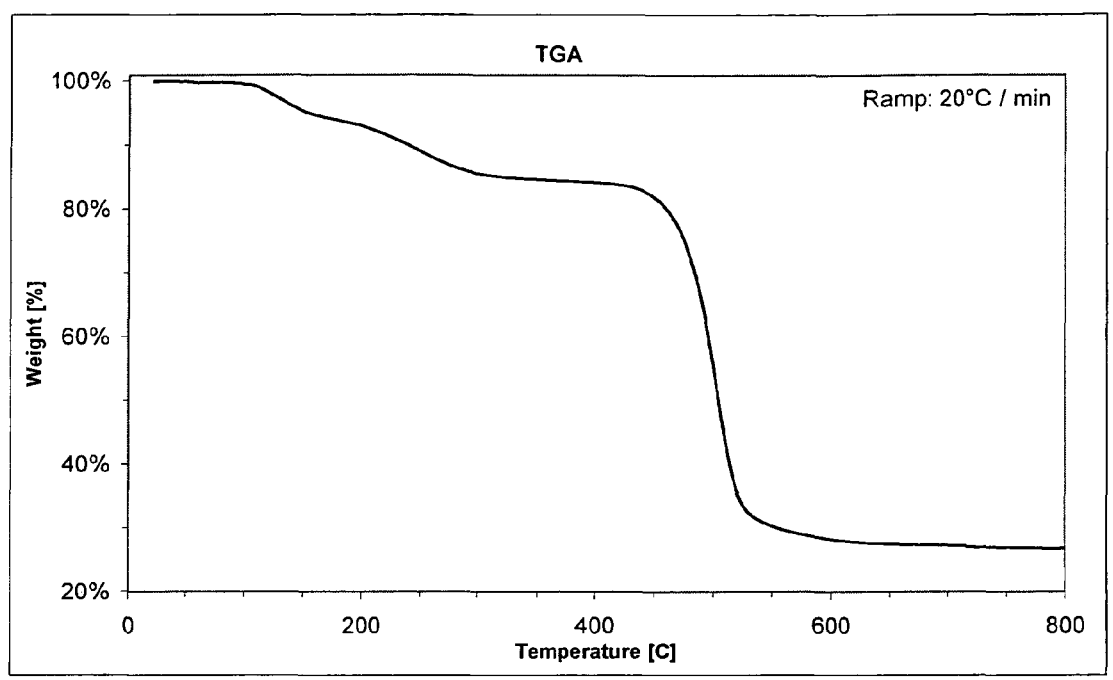
FIG. 3 shows the thermogravimetric diagram of high index of refraction Polymer 4.

3-(9-Phenanthrenyl)propyl trimethoxysilane (11.0 g, mmol)acetone (16.5 g) and 0.01M HCl were placed in a 100 ml rb flask and refluxed for 16 hours. At the beginning, the solution was milky white, but became clear soon after the hydrolysis started. When the polymerization further progressed, the solution turned again slightly cloudy. The volatiles were removed by evaporation under reduced pressure, giving white colorless powder 9.60 g. The polymer was stable up to 450° C. under argon, measured by TGA (FIG. 3.).

The casting solution was prepared by dissolving 2.06 g polymer in 8.24 g methyl ethyl ketone (400%) and a surfactant (5 mg, BYK®-307 of Byk-Chemie), and filtered through 0.2µ Teflon filter. The polymer was spin casted on a 4" silicon wafer at 3000 rpm. Soft bake at 150° C./5 mins, followed by the cure at 400° C./15 mins in N$_2$ ambient gave a film with index of refraction 1.671 at 632.8 nm and thickness of 840 nm. The dielectric constant of the film was 3.4 at 1 MHz. The film showed no sign of cracking. The film could be rubbed with organic solvents such as acetone without damaging it.

Example 21

High Index of Refraction Polymer 5

9-Phenanthrenyltriethoxysilane (17.00 g, 0.05 mol, prepared by Grignard reaction between 9-bromophenanthrene, magnesium, and tetraethoxysilane in THF) and acetone (15.00 g) were stirred until solids dissolved. Dilute nitric acid (0.01M HNO$_3$, 6.77 g, 0.38 mol) was then added. Two phases (water and organic) separated. The system was refluxed until the solution became clear (~15 min). Glycidyloxypropyltrimethoxysilane (3.00 g, 0.01) was added and the flask was refluxed for six hours. Volatiles were evaporated in rotary evaporator until 25.00 g polymer solution remained. N-propyl acetate (32.50 g) was added and evaporation continued again until 27 g remained. Next, propylene glycol monomethyl ether acetate (30 g) was added and again evaporated until 24.84 g was left as viscous polymer. Amount of nonvolatiles was measured to be 69.24%. More PGMEA (8.89 g) was added so that solid content was ~50%.

The solution was heated in oil bath (165° C.) and refluxed for 4 hours 20 minutes. The water that formed during the reaction was removed in rotary evaporator, along with PGMEA until 18 g remained. More PGMEA (42 g) was added to give solution with solid content 22.16%. Polymer had $M_n/M_w$=1,953/2,080 g/mol, as measured by GPC against monodisperse polystyrene standards in THF.

Example 22

High Index of Refraction Polymer Blends 1

A polymer having a high index of refraction, prepared as described in Example 19, was formulated with 10 g of a TiO$_2$ nanoparticle solution in methyl ethyl ketone having a solid content 5.1%. The polymer to TiO$_2$ nanoparticle ratio was 1:2 by weight. Surfactant (BYK-307 from BYK chemie, 5 mg) was added to the solution. The resultant material was spin-coated on a 4" wafer at 2,000 rpm. The film was soft baked at 130° C./5 min and cured at 300, 350 and 400° C./5 min. Following results were obtained:

TABLE 1

Results of High Index of Refraction Polymer Blends 1

| Sample | Cure temp. [° C.] | Film RI | Film thickness [nm] | Film shrinkage [%] |
|---|---|---|---|---|
| Polymer:TiO$_2$ 1:2 | 300 | 1.847 | 511 | 7 |
| Polymer:TiO$_2$ 1:2 | 350 | 1.837 | 498 | 10 |
| Polymer:TiO$_2$ 1:2 | 400 | 1.811 | 482 | 13 |

Example 23

High Index of Refraction Polymer Blends 2

A polymer having a high index of refraction, prepared as described in Example 18, was formulated with 10 g of a TiO$_2$ nanoparticle solution in methyl ethyl ketone having a solid content 5.1%. A surfactant (BYK-307 from BYK chemie, 5 mg) and a cationic initiator (Rhodorsil 2074, 10 mg) was added to the solution. The resultant material was spin-coated on a 4" wafer at 2,000 rpm. The film was soft baked at 130° C./5 min and cured at 200° C./5 min. The refractive index could be adjusted by altering the weight ratio of the polymer to the TiO$_2$ nanoparticle. The thickness of the resultant film could be adjusted by removal of formulation solvents under reduced pressure. Following results were obtained:

TABLE 2

Results of High Index of Refraction Polymer Blends 2

| Sample | Weight ratio | Formulation | Film RI | Film thickness [nm] |
|---|---|---|---|---|
| Polymer:TiO$_2$ | 3:1 | 1800% | 1.707 | 215 |
| Polymer:TiO$_2$ | 1:1 | 1800% | 1.797 | 283 |
| Polymer:TiO$_2$ | 1:2 | 320% | 1.833 | 849 |
| Polymer:TiO$_2$ | 1:3 | 1800% | 1.864 | 215 |

Example 24

High Index of Refraction Polymer Blend 3

A polymer having a high index of refraction, prepared as described in Example 18, was formulated with 20 g of a ZrO$_2$ nanoparticle solution in methyl ethyl ketone having a solid content 10%. Solvents were removed under reduced pressure to obtain a 300-400% solution. Then, a surfactant (BYK-307 from BYK chemie, 5 mg) and a cationic initiator (Rhodorsil 2074, 10 mg) was added to the solution. The resultant material was spin-coated on a 4" wafer at 2,000 rpm. The film was soft baked at 130° C./5 min and cured at various temperatures for 5 minutes. The refractive index could be adjusted by altering the weight ratio of the polymer to the ZrO$_2$ nanoparticle. The thickness of the resultant film could be adjusted by removal of formulation solvents under reduced pressure. Following results were obtained:

TABLE 3

Results of High Index of Refraction Polymer Blends 3

| Sample | Weight ratio | Formulation | Cure temp. [° C.] | Film RI | Film thickness [nm] |
|---|---|---|---|---|---|
| Polymer:ZrO$_2$ | 1:1 | 300% | 200 | 1.732 | 910 |
| Polymer:ZrO$_2$ | 1:2 | 300% | 200 | 1.767 | 730 |
| Polymer:ZrO$_2$ | 1:3 | 350% | 200 | 1.798 | 591 |
| Polymer:ZrO$_2$ | 1:3 | 350% | 250 | 1.792 | 578 |
| Polymer:ZrO$_2$ | 1:3 | 350% | 300 | 1.730 | 567 |

Example 25

High Index of Refraction Polymer Blend 4

A polymer having a high index of refraction, prepared as described in Example 19, was formulated with 20 g of a ZrO$_2$ nanoparticle solution in methyl ethyl ketone having a solid content 10%. Solvents were removed under reduced pressure to obtain a 300-450% solution. Then, a surfactant (BYK-307 from BYK chemie, 5 mg) was added to the solution. The resultant material was spin-coated on a 4" wafer at 2,000 rpm. The film was soft baked at 130° C./5 min and cured at various temperatures for 5 min. The refractive index could be adjusted by altering the weight ratio of the polymer to the ZrO$_2$ nanoparticle. The thickness of the resultant film could be adjusted by removal of formulation solvents under reduced pressure. Following results were obtained:

TABLE 4

Results of High Index of Refraction Polymer Blends 4.

| Sample | Weight ratio | Formulation | Cure temp. [° C.] | Film RI | Film thickness [nm] |
|---|---|---|---|---|---|
| Polymer:ZrO$_2$ | 1:1 | 300% | 200 | 1.728 | 752 |
| Polymer:ZrO$_2$ | 1:1 | 300% | 250 | 1.724 | 701 |
| Polymer:ZrO$_2$ | 1:1 | 350% | 300 | 1.714 | 664 |
| Polymer:ZrO$_2$ | 1:1 | 350% | 350 | 1.694 | 712 |
| Polymer:ZrO$_2$ | 1:1 | 350% | 400 | 1.685 | 631 |
| Polymer:ZrO$_2$ | 1:3 | 450% | 200 | 1.789 | 378 |
| Polymer:ZrO$_2$ | 1:3 | 450% | 250 | 1.752 | 364 |
| Polymer:ZrO$_2$ | 1:3 | 450% | 300 | 1.718 | 356 |
| Polymer:ZrO$_2$ | 1:3 | 450% | 350 | 1.676 | 396 |
| Polymer:ZrO$_2$ | 1:3 | 450% | 400 | 1.660 | 350 |

Example 26

Waterborne Siloxane matrix 1

A waterborne Siloxane polymer matrix was prepared by adding glycidoxypropyl-trimethoxysilane (500 g, 2.12 mol) into a 2 L round bottom flask equipped with a reflux condenser and a Teflon covered magnetic stir bar. While stirring vigorously, 0.01M trifluoromethane sulfonic acid in water (500 g) was added into the flask. After obtaining a homogenous mixture, the flask was immersed into an oil bath and allowed to reflux for 17 hours. Then, the solution was cooled to room temperature and volatiles were removed under reduced pressure until a solution with a solid content of 55% was obtained. This polymer displayed an M$_w$/M$_n$=15844/12190, measured by GPC against monodisperse polystyrene standards. The polymer solution, when mixed with water in 1:1 ratio, displayed a pH=2.3. An aliquot of this material was formulated to obtain a 770% water solution. The resultant solution was spin-coated on a 4" wafer at 1,300 rpm and bake on a hotplate 100° C./1 min. A 303 nm thick film with RI=1.482 was obtained.

Example 27

Waterborne Siloxane matrix 2

Figure 4:
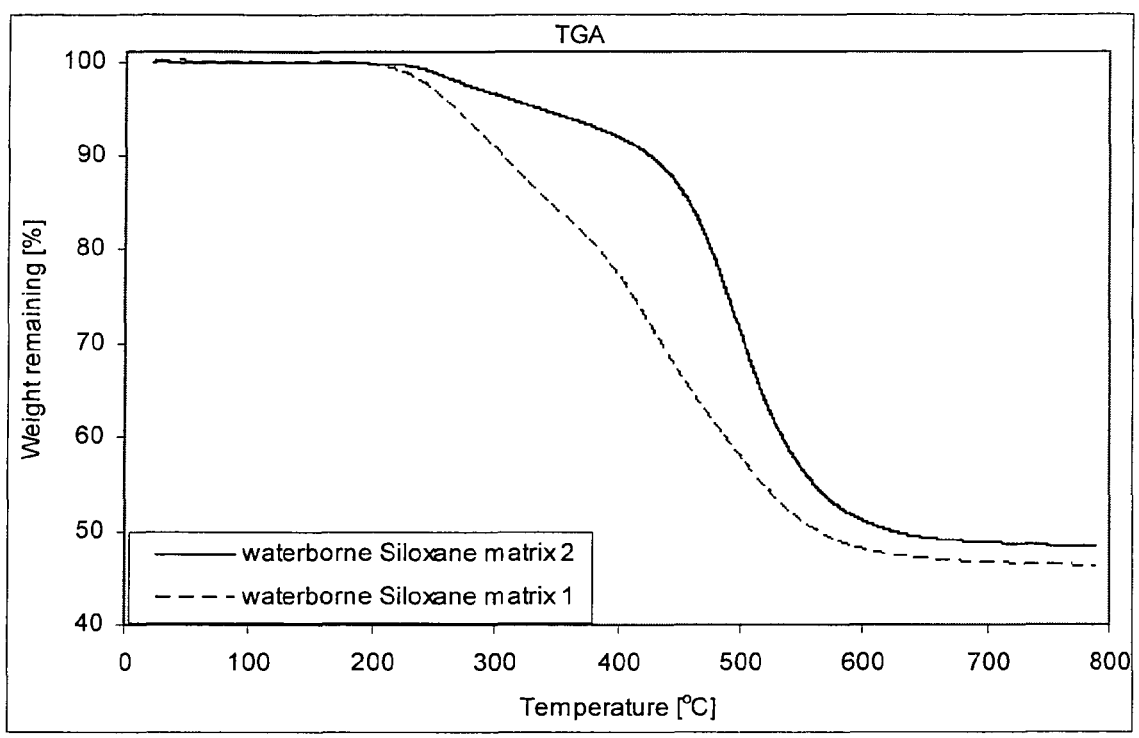
FIG. 4 shows the thermogravimetric diagram of two waterborne siloxane matrices.

A waterborne Siloxane polymer matrix was prepared by adding 2-(3,4-epoxycyclohexyl)-ethyltriethoxysilane (100 g, 0.35 mol) into a 500 ml round bottom flask equipped with a reflux condenser and a Teflon covered magnetic stir bar. While stirring vigorously, 0.01M trifluoromethane sulfonic acid in water (100 g) was added into the flask. After obtaining a homogenous mixture, the flask was immersed into an oil bath and refluxed for 17 hours. The solution was cooled to room temperature and volatiles were removed under reduced pressure until a solution with a solid content of 50% was obtained. This polymer displayed improved thermal stability compared to waterborne Siloxane matrix 1, described in Example 27 (FIG. 4). The material was formulated with propylene glycol methyl ether to obtain a 630% solution. The resultant solution was spin-coated on a 4" wafer at 1,300 rpm and bake on a hotplate 120° C./1 min. A 671 nm thick film with RI=1.517 was obtained.

Example 28

Waterborne High Index of Refraction Polymer Blends 1

A waterborne Siloxane matrix prepared as described in example 26 was formulated with 10 g of waterborne $CeO_2$ nanoparticle solution having a solid content of 17%. The resultant material was spin-coated on a 4" wafer at 2,000 rpm. The film was soft baked at 130° C./5 min and cured at 200° C./5 min. The refractive index could be adjusted by altering the weight ratio of the polymer to the $CeO_2$ nanoparticle. The thickness of the resultant film can be altered by evaporation of volatile compounds under reduced pressure after formulation.

TABLE 5

Results of Waterborne High Index of Refraction Polymer Blends 1.

| Sample | Weight ratio | Formulation | Cure temp. [° C.] | Film RI | Film thickness [nm] |
|---|---|---|---|---|---|
| Polymer:$CeO_2$ | 1:3 | 490% | 200 | 1.767 | 227 |
| Polymer:$CeO_2$ | 1:5 | 490% | 200 | 1.816 | 181 |
| Polymer:$CeO_2$ | 1:5 | 185% | 200 | 1.805 | 451 |

Example 29

Waterborne High Index of Refraction Polymer Blends 2

A waterborne Siloxane matrix prepared as described in example 27 was formulated with 10 g of waterborne $CeO_2$ nanoparticle solution having a solid content of 17%. Propylene glycol methyl ether (2 g) was added and volatile compounds were removed under reduced pressure to obtain thicker films. The resultant material was spin-coated on a 4" wafer at 2,000 rpm. The film was soft baked at 130° C./5 min and cured at 200° C./5.

TABLE 6

Results of Waterborne High Index of Refraction Polymer Blends 2.

| Sample | Weight ratio | Formulation | Cure temp. [° C.] | Film RI | Film thickness [nm] |
|---|---|---|---|---|---|
| Polymer:$CeO_2$ | 1:5 | 400% | 200 | 1.807 | 324 |

Example 30

Waterborne High Index of Refraction Polymer Blends 3

Waterborne $CeO_2$ nanoparticles (32.8 g) having a solid content of 17% were placed into a 100 ml round bottom flask. Isopropyl alcohol (0.5 g) was added and volatiles were removed under reduced pressure. The resultant weight of the $CeO_2$ nanoparticle solution was 15.7 g. 10 g of the obtained concentrated nanoparticle solution was used to formulate a waterborne Siloxane matrix prepared as described in example 27. Propylene glycol methyl ether (2 g) was added to the formulation. The resultant material was spin-coated on a 4" wafer at 2,000 rpm. The film was soft baked at 130° C./5 min and cured at 200° C./5.

TABLE 7

Results of Waterborne High Index of Refraction Polymer Blends 3.

| Sample | Weight ratio | Formulation | Cure temp. [° C.] | Film RI | Film thickness [nm] |
|---|---|---|---|---|---|
| Polymer:$CeO_2$ | 1:5 | 210% | 200 | 1.810 | 497 |

Example 31

Waterborne High Index of Refraction Polymer Blends 4

A waterborne Siloxane matrix prepared as described in example 26 was formulated with 10 g of waterborne $TiO_2$ nanoparticle solution having a solid content of 16%. Volatile compounds were removed under reduced pressure to obtain thicker films. Then, a surfactant (FC-4432 from 3M Company, 5 mg) was added to the solution. The resultant material was spin-coated on a 4" wafer at 2,000 rpm. The film was soft baked at 136° C./5 min and cured at 200° C./5 mm.

TABLE 8

Results of Waterborne High Index of Refraction Polymer Blends 4.

| Sample | Weight ratio | Formulation | Cure temp. [° C.] | Film RI | Film thickness [nm] |
|---|---|---|---|---|---|
| Polymer:$TiO_2$ | 1:5 | 450% | 200 | 1.849 | 466 |
| Polymer:$TiO_2$ | 1:5 | 450% | 250 | 1.842 | 457 |

Example 32

Waterborne High Index of Refraction Polymer Blends 5

A waterborne Siloxane matrix prepared as described in example 26 was formulated with 10 g of waterborne $SnO_2$ nanoparticle solution having a solid content of 13%. The resultant material was spin-coated on a 4" wafer at 1,000 rpm. The film was soft baked at 130° C./5 min and cured at 200° C./5 min and 250° C./5 min.

TABLE 9

Results of Waterborne High Index of Refraction Polymer Blends 5.

| Sample | Weight ratio | Formulation | Cure temp. [° C.] | Film RI | Film thickness [nm] |
|---|---|---|---|---|---|
| Polymer:$SnO_2$ | 1:5 | 590% | 200 | 1.630 | 238 |
| Polymer:$SnO_2$ | 1:5 | 590% | 250 | 1.640 | 209 |

Example 32

Waterborne High Index of Refraction Polymer Blends 6

A waterborne Siloxane matrix prepared as described in example 26 was formulated with 10 g of waterborne $ZrO_2$ nanoparticle solution having a solid content of 24%. The resultant material was spin-coated on a 4" wafer at 1,000 rpm. The film was soft baked at 130° C./5 min and cured at 200° C./5 min and 250° C./5 min.

TABLE 10

Results of Waterborne High Index of Refraction Polymer Blends 6.

| Sample | Weight ratio | Formulation | Cure temp. [° C.] | Film RI | Film thickness [nm] |
|---|---|---|---|---|---|
| Polymer:$ZrO_2$ | 1:5 | 270% | 200 | 1.624 | 552 |
| Polymer:$ZrO_2$ | 1:5 | 270% | 250 | 1.622 | 546 |

All high index of refraction polymers were also tested for trench gap-fill with trenches 1 um (width)×4 um (height). All polymers showed excellent gap-fill performance and showed no cracking after 400° C./15 mins in $N_2$ ambient.

It was also found out that all high index of refraction polymers 1-5 that are compatible with CMP (chemical mechanical polishing). It was found advantageous that cure films first at 150 to 300° C. prior performing CMP with traditional oxide CMP slurry and then applying additional higher temperature cure at 180 to 450° C. When first cured at lower temperature the film gets only partially cured, i.e., some residual silanols remains in the film. Due to silanols the polymer films is still slightly hydrophilic, which preferable when performing oxide CMP process. All polymers were also compatible with etch back process by using oxygen plasma. The polymer film etched very uniformly about 100 mm per minute when applying oxygen plasma and the plasma process did not cause any index of reaction shift, surface roughness increase or defect formation. It is worth notifying that conventional high index of refraction organic polymers cannot be CMP and etch back processed without damaging the film surface quality or changing the film optical properties.

There are also three important technical issues for new generations of CMOS image sensors (FIG. 1) that can be reached with above-mentioned chemistries: size of the device; speed and power consumption; quantum efficiency.

Explanation of FIG. 1: 10 semiconductor substrate; 20 photo-diode; 30 metal lines, interlayer dielectrics and inter-metal dielectrics; 40 colour filter array layer; 50 micro-lens array; 100 high aspect ratio photo-diode gap filled with high index of refraction siloxane polymer; 200 high index of refraction siloxane polymer for color filter planarization and passivation and; 300 micro-lens passivation siloxane polymer.

Size of the device: the smaller the pixel the greater the number of pixels on same area, i.e., improved field factor. This is can be achieved by reducing lens size, diode size, thinner metallization and applying multiple levels of metal.

Speed: shortening the metal lines, improving the conductor Cu versus Al and lowering the k value of the dielectric will improve speed and reduce power consumption.

Quantum efficiency: this is an opportunity to improve the device efficiency by using new materials that bring light into the lens and transmit light down to the diodes.

Materials deposited before the color filter array and be cured at relatively high temperatures to lock in their mechanical properties and being compatible with other materials used in chip construction. Materials deposited after the color filters are deposited must be fully cured at lower temperatures ca 250° C. or below. Materials of this invention are highly suitable for applications above and below the color filter array.

Maximizing quantum efficiency: Light incident on the lens is focused and passes through the color filter and is transmitted down to the diode in the device layer. The objective is to maximize the amount of light reaching the diode. For example the material immediately above the diode needs to be transparent and transmit the maximum amount of light. The interface of the sidewalls of material 100 at FIG. 1 is a source of light loss due to refraction and reduces the light reflected down into the diode. A simple solution is to line the sidewall with a reflective coating but that would add expense and would be very difficult. Also CVD metal deposition will make the channel narrower (reducing light transmission) and eventually pinch off at the top for narrow features. However if material 100 has a higher index of refraction than the material used to make the wall next to it then refraction will be minimized and more light will be guided down to the diode. Thus the metallization is surrounded by CVD $SiO_2$ which forms the sidewall for the light channel. CVD oxide has an index of refraction approx of 1.46 at 632.8 nm wavelength range and so the light channel needs to have refractive index>1.46 to reduce refraction at the interface. Thus basically this is a vertical waveguide transmitting light to the diode. Thus a polymer from Example 19 based material with high index of refraction would function well for this application. This is a transparent film and thus would be mechanically compatible with the neighboring CVD $SiO_2$. The index of refraction of polymer from Example 19 is 1.65 and thus would increase the reflectivity of the light from the oxide sidewalls with refractive index of 1.46. While this material can be cured at low temperatures of 250° C., it can also be cured at higher temperatures above 400° C. to be compatible with processes required with Al, Cu and $SiO_2$. Furthermore as devices are made smaller and metallization shortened to improve speed, the aspect ratio for the channel increases.

Passivation of the Color Filters and the Lenses: The material (200 in FIG. 1) above the color filter array is another opportunity for an inexpensive enhancement for device performance. A polymer from Example 18 is transparent to visible light yet effectively blocks UV thus light protecting both the color filter and the diode as well as signal noise. Also the polymer from Example 18 is an excellent planarizing material and an effective passivation layer. The polymer also matches the index of refractions between color filter layer and micro-lens layer, thus reduces reflection from the film interfaces. Also this material can be cured at low temperatures ~200° C. and therefore does not cause thermal degradation to organic color filter materials.

I claim:

1. A method for producing a polymer composition for semiconductor optoelectronics, comprising the steps of
providing a monomer having the formula:

$$(R_1)_xSi(R_2)_y \text{ or} \quad \text{Ia}$$

$$(R_1)_xSi-R_3-Si(R_2)_y \quad \text{IIa}$$

wherein:
$R_1$ is a hydrolysable group
$R_2$ is a phenanthrene or anthracene group,
$R_3$ is an optional bridging linear or branched bivalent hydrocarbyl group, and x and y are integers from 1 to 3,
homo- or copolymerizing the monomer to produce a polymer or copolymer, and
combining 100 parts by weight of the polymer or copolymer with 1 to 500 parts by weight of nanoparticles selected from the group consisting of metals, metal alloys, metal oxides, carbides and nitrides and mixtures thereof to provide a nanoparticle containing polymer composition.

2. The method according to claim 1, wherein the polymer or copolymer is combined with 5 to 100 parts by weight, in particular about 10 to 50 parts by weight of nanoparticles with 100 parts by weight of the polymer or copolymer.

3. The method according to claim 1, wherein the polymer or copolymer is combined with the nanoparticles by blending.

4. The method according to claim 1, wherein the nanoparticles are contacted with the polymers or copolymers at conditions conducive to the formation of chemical or physical bonds between the polymer or copolymer and the nanoparticles.

5. The method according to claim 1, wherein the composition comprises chemically bonded nanoparticles and a blend of distinct polymers wherein the blend of distinct polymers comprises an ordered copolymer.

6. The method according to claim 1, wherein the nanoparticle surface contains one or more silane coupling groups, or the polymers or copolymers have reactive groups capable of reacting with the nanoparticles and forming a bond between.

7. The method according to claim 6, wherein the silane coupling groups are selected from amino propyl trimethoxysilane, methacryloxy propyl trimethoxysilane and glysidoxy propyl trimethoxysilane and other epoxy groups and combinations thereof.

8. The method according to claim 1, wherein the nanoparticles are selected from the group consisting of $TiO_2$ and $Ta_2O_5$ and mixtures thereof.

9. The method according to claim 1, wherein the nanoparticles are coupled to the polymer via covalent bonding.

10. The method according to claim 1, wherein the average particle size of the nanoparticles is about 0.5 to 20 nm, preferably about 1 to 18 nm.

11. A method of producing a thin film for optoelectronics comprising depositing on a semiconductor substrate a film obtainable by polymerization of an organo functionalized monomer having the formula:

$$(R_1)_xSi(R_2)_y \quad \text{Ia}$$

or $$(R_1)_xSi-R_3-Si(R_2)_y \quad \text{IIa}$$

wherein:
$R_1$ is a hydrolysable group
$R_2$ is a phenanthrene or anthracene group,
$R_3$ is an optional bridging linear or branched bivalent hydrocarbyl group, and
x and y are integers from 1 to 3,
said polymer being produced by homo- or copolymerizing the monomer to produce a polymer which is then further contacted with nanoparticles to form a polymer composition, which is applied on a substrate in the form of a layer and cured to form a film.

12. The method according to claim 11, wherein a thin film is produced from a monomer of the above formula, wherein independently
$R_1$ is selected from the group of hydrogen, halides, alkoxy and acyloxy groups, and
$R_3$ is selected from linear and branched alkylene groups, alkenylene groups, alkynylene groups, bivalent alicyclic groups, bivalent polycyclic groups, and bivalent aromatic groups.

13. The method according to claim 11, wherein the polymerized composition comprises a cross-linked poly(organosiloxane) nanoparticle composition.

14. The method according to claim 11, wherein the composition is obtained essentially by homopolymerization of monomers having formula IIa.

15. The method according to claim 11, wherein the composition is obtained by copolymerizing first monomers having formula IIa wherein $R_3$ stands for a linear bivalent hydrocarbyl residue, with second monomers having formula IIa wherein $R_3$ stands for a branched bivalent hydrocarbyl residue, the molar ratio of the first monomers to the second monomers is 95:5 to 5:95, in particular 90:10 to 10:90, preferably 80:20 to 20:80.

16. The method according to claim 11, comprising producing a cured thin layer of the poly(organosiloxane) nanoparticle composition having a thickness of 0.01 to 50 μm, in particular 0.5 to 5 μm, preferably from 1 to 3 μm.

17. A polymer composition for semiconductor optoelectronics, comprising a homo- or copolymer component obtained by homo- or copolymerizing at least one monomer of formulas Ia or IIa $$(R_1)_xSi(R_2)_y \text{ or} \quad \text{Ia}$$

$$(R_1)_xSi-R_3-Si(R_2)_y \quad \text{IIa}$$

wherein:
$R_1$ is a hydrolysable group
$R_2$ is a phenanthrene or anthracene group,
$R_3$ is an optional bridging linear or branched bivalent hydrocarbyl group, and x and y are integers from 1 to 3,
in combination with nanoparticles selected from the group consisting of metals, metal alloys, metal oxides, carbides and nitrides and mixtures thereof.

18. The composition according to claim 17, comprising 1 to 500 parts by weight, preferably about 5 to 100 parts by weight, in particular about 10 to 50 parts by weight of nanoparticles in combination with 100 parts by weight of the polymer or copolymer.

19. The composition according to claim 17, wherein at least a part of substituents $R_2$ comprise a polar group.

* * * * *